(12) United States Patent
Yu et al.

(10) Patent No.: US 8,305,243 B2
(45) Date of Patent: Nov. 6, 2012

(54) SYSTEMS AND METHODS FOR COMPRESSING DATA AND CONTROLLING DATA COMPRESSION IN BOREHOLE COMMUNICATION

(75) Inventors: Bo Yu, Sugar Land, TX (US); Han Yu, Sugar Land, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 77 days.

(21) Appl. No.: 12/828,262

(22) Filed: Jun. 30, 2010

(65) Prior Publication Data

US 2012/0001776 A1  Jan. 5, 2012

(51) Int. Cl.
*H03M 7/00* (2006.01)

(52) U.S. Cl. .............. 341/50; 341/155; 341/118; 702/6; 702/10

(58) Field of Classification Search .................. 341/118, 341/120, 50, 155, 67, 65; 702/6, 10
See application file for complete search history.

(56) References Cited

U.S. PATENT DOCUMENTS

| | | | |
|---|---|---|---|
| 3,309,656 A | 3/1967 | Godbey | |
| 5,331,318 A * | 7/1994 | Montgomery | ............. 340/855.4 |
| 5,375,098 A | 12/1994 | Malone et al. | |
| 5,381,092 A | 1/1995 | Freedman | |
| 6,405,136 B1 * | 6/2002 | Li et al. | ............................ 702/10 |
| 6,626,253 B2 | 9/2003 | Hahn et al. | |
| 7,200,492 B2 | 4/2007 | Hassan et al. | |
| 7,647,182 B2 * | 1/2010 | Hassan et al. | ...................... 702/6 |
| 7,805,247 B2 * | 9/2010 | Hsu et al. | .......................... 702/6 |
| 2009/0190850 A1 | 7/2009 | Tang | |

FOREIGN PATENT DOCUMENTS

WO  20100059151 A1  5/2010

OTHER PUBLICATIONS

International Search Report and Written Opinion of the International Search Authority dated Feb. 29, 2012 in the Corresponding PCT Application PCT/US2011/042612.

* cited by examiner

*Primary Examiner* — Peguy Jean Pierre
(74) *Attorney, Agent, or Firm* — Chadwick A. Sullivan

(57) ABSTRACT

Systems and methods compress data and control data compression in borehole communication. The systems and methods convert original data collected by a sensor from a first domain into a second domain, wherein the original data is associated with one or more properties of an underground formation. A predetermined number of significant coefficients is selected from components of the second domain, wherein the predetermined number of significant coefficients are components of the second domain with largest amplitudes. The selected predetermined number of significant coefficients is quantized via an quantization technique and the selected predetermined number of significant coefficients is encoded into compressed data via an encoder.

23 Claims, 8 Drawing Sheets

FIG.2
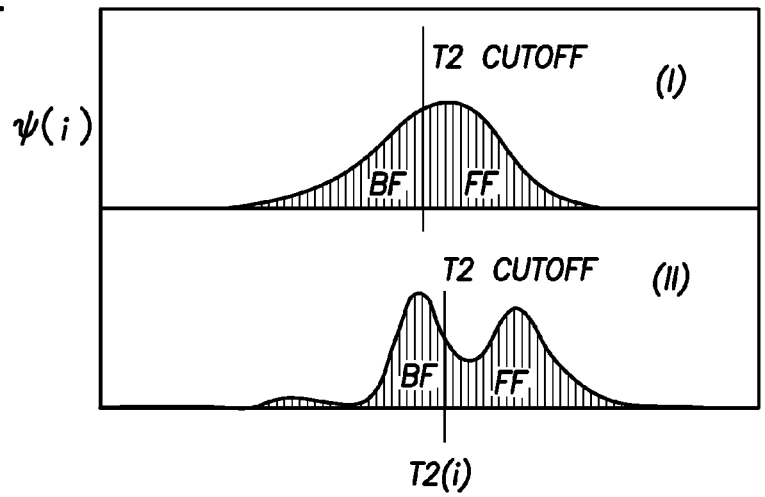
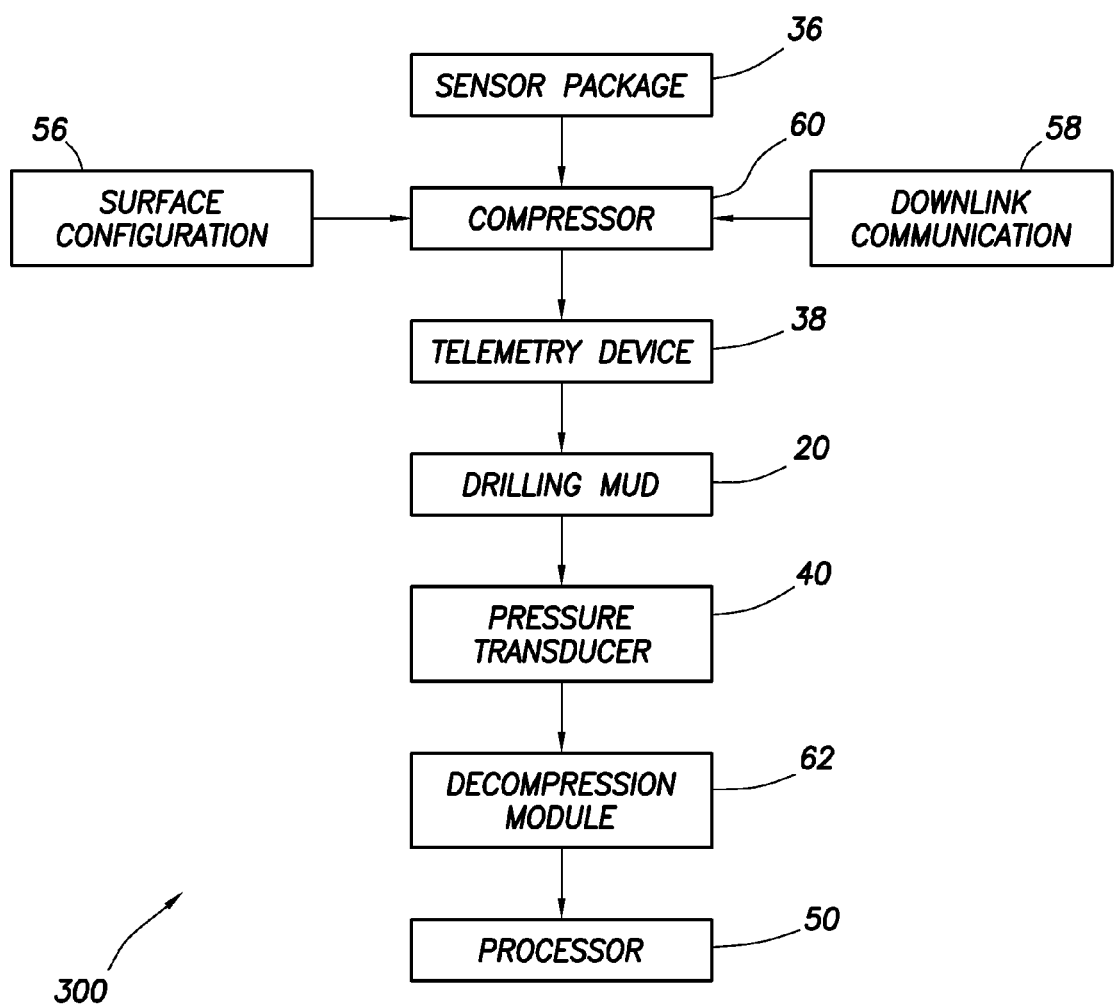
FIG.3

SYSTEMS AND METHODS FOR COMPRESSING DATA AND CONTROLLING DATA COMPRESSION IN BOREHOLE COMMUNICATION

BACKGROUND

A wellbore or borehole is generally drilled into the ground to recover natural deposits of hydrocarbons and/or other desirable materials trapped in a geological formation in the Earth's crust. The wellbore or borehole is typically drilled using a drill bit attached to a lower end of a drill string. The wellbore or borehole may be drilled to penetrate subsurface geological formation in the Earth's crust that contain the trapped hydrocarbons and/or other materials. As a result, the trapped hydrocarbons and/or materials may be released and/or recovered via the wellbore or borehole.

A bottom hole assembly (hereinafter "BHA") is typically located at the lower end of the drill string and includes the drill bit along with one or more sensors, control mechanisms and/or circuitry. Traditionally, the one or more sensors of the BHA detects or measures one or more downhole measurements associated with one or more properties of the subsurface geological formation and/or fluid or gas contained within the formation. Additionally, the one or more sensors of the BHA detects or measures one or more downhole measurements associated with an orientation and/or a position of the BHA and the drill bit with respect to the subsurface geological formation, the natural deposits of hydrocarbons, other materials, and/or the surface of the Earth.

Drilling operations for the drill bit located at the BHA of the drill string are controlled by one or more operators located at the Earth's surface or at an operations support center located locally or remotely with respect to the well, borehole and/or the drill string. The drill string is rotated at a rotational rate by a rotary table, or a top drive located at the Earth's surface. The one or more operators controls the rotational rate, an amount of weight-on-bit and/or other operating parameters associated with the drilling process.

Drilling fluid is pumped from the Earth's surface to the drill bit via an interior passage of the drill string. The drilling fluid cools and lubricates the drill bit during the drilling process. Additionally, the drilling fluid transports drill cuttings from the geological formations by the drill bit, uphole to the Earth's surface.

To facilitate successful and desirable drilling operations for the borehole, the one or more operators must have access to and/or be aware of the downhole measurements made by the one or more sensors of the BHA. In order for the one or more operators to access the downhole measurements for controlling and/or steering the drill bit and/or a direction of the drill bit, a communication link must be established and/or provided between the one or more operators at the Earth's surface and the BHA of the drill string. A "downlink" is known to be a communication link extending downhole from the Earth's surface to the BHA of the drill string. Based on the downhole measurements collected at the BHA, the one or more operators transmit commands downhole to the BHA via the downlink to steer the drill string.

An "uplink" is known to be a communication link uphole from the BHA of the drill string to the Earth's surface. An uplink is typically a transmission of the data and/or information associated with the one or more downhole measurements which may be detected, measured and/or collected by the one or more sensors located at the BHA. For example, it is often important for an operator to know the orientation of the BHA with respect to the formation. Thus, orientation data and/or measurements detected and/or collected by one or more sensors located at the BHA is transmitted uphole from the BHA to the Earth's surface via the uplink.

A known telemetry system for providing communication (i.e., downlink and/or uplink communications) between the Earth's surface and the BHA is mud pulse telemetry. Mud pulse telemetry is a method of sending or transmitting data, one or more commands and/or one or more measurements via one or more signals, either downlink or uplink communications, by creating one or more pressure and/or flow rate pulses (hereinafter "pressure pulses") in the drilling mud. A pattern of pressure pulses, such as a frequency, a phase, and/or an amplitude, is representative of the data, the one or more commands and/or one more measurements received or transmitted by the one or more operators located at the Earth's surface to the BHA. The pattern of pressure pulses is detected by at least one sensor of the BHA via downlink communications or by at least one sensor at the Earth's surface via uplink communications. The pattern of pressure pulses is interpreted by the at least one sensor and/or a processor such that the data, the one or more commands and/or the one or more measurements is understood by the processor, the BHA and/or the operators located at the Earth's surface.

Often, the one or more commands and/or one or more measurements which are represented by the pattern of pressure pulses include a large quantity of data. In order to transmit a large quantity of data, it is generally known to compress the large quantity of data into a smaller quantity of data via one or more data compression techniques. Then, the smaller quantity of compressed data may be transmitted between locations more efficiently and/or more effectively. However, known data compression techniques utilized in, for example, audio and/or video data compression do not perform with the low bandwidth and high noise level associated with the communication link between the Earth's surface and the BHA. As a result, known data compression techniques are not suitable for use with the communication link between the Earth's surface and the BHA. Moreover, known data compression techniques do not adequately compress large quantities of data and/or measurements collected downhole. As a result, large quantities of data and/or measurements collected downhole are unable to be transmitted uphole to the Earth's surface or are inaccurately and/or ineffectively transmitted uphole to the Earth's surface.

BRIEF DESCRIPTION OF THE DRAWINGS

So that the above recited features and advantages of the present invention can be understood in detail, a more particular description of the invention, briefly summarized above, may be had by reference to the embodiments thereof that are illustrated in the appended drawings. It is to be noted, however, that the appended drawings illustrate only typical embodiments of this invention and are therefore not to be considered limiting of its scope, for the invention may admit to other equally effective embodiments.

FIG. 2 illustrates a graph of nuclear magnetic resonance $T_2$ (hereinafter "NMR $T_2$") distribution waveform measurements collected by a downhole tool in an embodiment of the present invention.

FIG. 3 illustrates a flow chart of borehole communication in an embodiment of the present invention.

DETAILED DESCRIPTION OF EMBODIMENTS

The present invention relates to wellbore communication systems and methods for compressing data for transmission between the Earth's surface and a BHA of a drill string while drilling a wellbore. Embodiments of the present invention may be utilized with vertical, horizontal and/or directional drilling.

Figure 1:
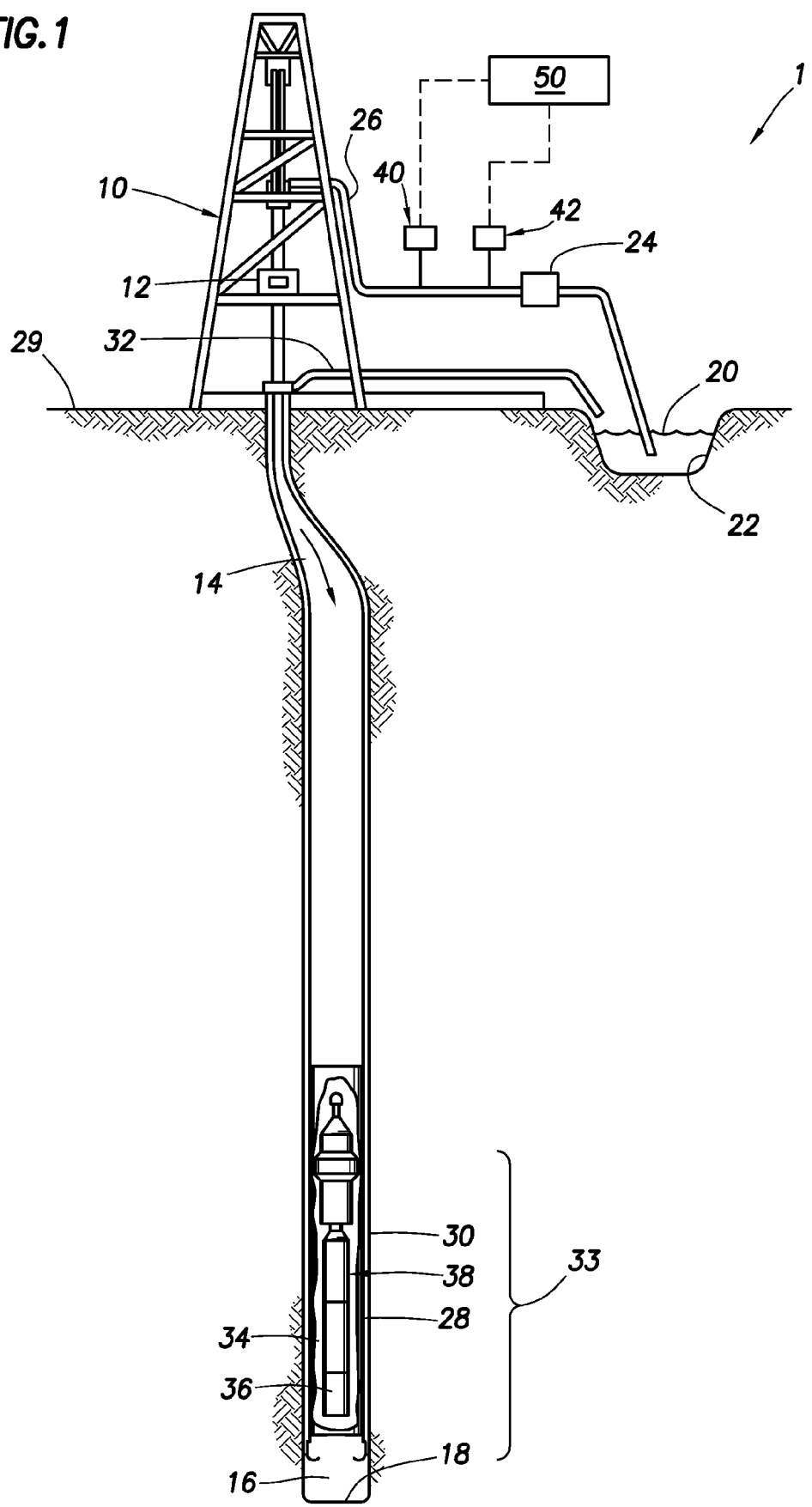
FIG. 1 illustrates a schematic diagram, including a partially cross-sectional view, of a drilling system having wellbore telemetry device and a downhole tool connected to a drill string and deployed from a rig into a wellbore.

Referring now to the drawings wherein like numerals refer to like parts, FIG. 1 schematically illustrates a known drilling system 1, which may be on-shore or off-shore, in which the present systems and methods for compressing data and/or information in borehole communication may be implemented. The drilling system 1 may be an on-shore drilling system having a drilling rig 10 which may include a drive mechanism 12 to provide a driving torque to a drill string 14. The lower end of the drill string 14 may extend into a wellbore 30 and carry a drill bit 16 to drill an underground formation 18. During drilling operations, drilling mud 20 may be drawn from a mud pit 22 on at the Earth's surface 29 via one or more pumps 24, such as, for example, one or more reciprocating pumps. The drilling mud 20 may be circulated through a mud line 26 down through the drill string 14, through the drill bit 16, and back to the surface 29 via an annulus 28 between the drill string 14 and the wall 30 of the wellbore. Upon reaching the surface 29, the drilling mud 20 is discharged through a line 32 into the mud pit 22 so that drill cuttings, such as, for example, rock and/or other well debris carried uphole in the drilling mud can settle to the bottom of the mud pit 22 before the drilling mud 20 is recirculated into the drill string 14.

The drill string 14 includes a bottom hole assembly 33 (hereinafter "BHA 33") which may be located at, near or adjacent to the underground formation 18, the drill bit 16 and/or the wall 30 of the wellbore. The BHA 33 of the drill string 14 may include at least one downhole tool and/or sensor 34 (hereinafter "tool 34"). It should be understood that the BHA 33 of the drill string 14 may include any number of downhole tools, downhole sensors and/or other features as known to one of ordinary skill in the art.

The drilling mud 20 returning to the Earth's surface 29 may flow uphole between the drill string 14 and the wall 30 of the wellbore via the annulus 28. The tool 34 may contain survey or measurement tools, such as, logging-while-drilling tools (hereinafter "LWD tools") and measuring-while-drilling tools (hereinafter "MWD tools"). Moreover, the tool 34 transmits data, in real-time, uphole to the Earth's surface via one or more telemetry devices and/or systems.

The tool 34 may be any device or component for measuring one or more characteristics and/or properties of the wall 30 of the wellbore, the underground formation 18, and/or the drill string 14. The tool 34 may, for example, include one or more LWD tools having capabilities for measuring, processing, and storing data and/or information, as well as for communicating with surface equipment. Additionally, the LWD tools may include one or more of the following types of logging devices that measure one or more characteristics and/or properties associated with the underground formation 18 and/or the wellbore: a resistivity measuring device; a directional resistivity measuring device; a sonic measuring device; a nuclear measuring device; a nuclear magnetic resonance measuring device; a pressure measuring device; a seismic measuring device; an imaging device; a formation sampling device; a natural gamma ray device; a density and photoelectric index device; a neutron porosity device; and a borehole caliper device. It should be understood that the tool 34 may be any LWD tool as known to one or ordinary skill in the skill.

For example, the tool 34 may be a LWD tool, such as, a real-time reservoir steering tool which may perform and/or execute one or more time-based measurements, such as, for example, nuclear magnetic resonance measurements (hereinafter "NMR measurements") in the wellbore. The NMR measurements detected by the tool 34 may be accessed, in real-time, by the one or more operators at the Earth's surface. As a result, the one or more operators at the Earth's surface may be able to evaluate, in real-time, a productivity of a reservoir or the wellbore, an optimization of the wellbore trajectory and/or conduct reservoir steering based on the NMR measurements collected by the tool 34.

The tool 34 may be located adjacent to the drill bit 16 and/or may include one or more components (not shown in the drawings) for collecting and/or detecting the one or more time-based measurements. Alternatively, the tool 34 may be located anywhere within the BHA 33. The one or more components of the tool 34 may include, for example, a turbine, a motion characterization package, one or more telemetry connections, one or more magnets, one or more antennas, one or more wear bands and/or one or more stabilizer. It should be understood that one or more components of the tool 34 may be any components capable of collecting and/or obtaining the one or more time-based measurements in the wellbore as known to one of ordinary skill in the art.

In embodiments, the tool 34 may include one or more MWD tools which may include one or more devices for measuring one or more characteristics and/or properties of the drill bit 16 and/or the drill string 14. The MWD tools may include one or more of the following types of measuring devices: a weight-on-bit measuring device; a torque measuring device; a vibration measuring device; a shock measuring device; a stick slip measuring device; a direction measuring device; an inclination measuring device; a natural gamma ray device; a directional survey device; a tool face device; a borehole pressure device; and a temperature device. The MWD tools may detect, collect and/or log data and/or information about the conditions at the drill bit 16, around the underground formation 18, at a front of the drill string 14 and/or at a distance around the drill strings 14. It should be understood that the tool 34 may be any MWD tool as known to one of ordinary skill in the art.

In embodiments, the tool 34 may include a wireline configurable tool which may be a tool commonly conveyed by wireline cable as known to one having ordinary skill in the art. For example, the wireline configurable tool may be a logging tool for sampling or measuring characteristics of the underground formation 18, such as gamma radiation measurements, nuclear measurements, density measurements, and porosity measurements. In embodiments, the tool 34 may be a well completion tool for extracting reservoir fluids after completion of drilling. It should be understood that the tool 34 may be any wireline configurable tool as known to one or ordinary skill in the art.

In embodiments, the tool 34 may include an electronic sensor package 36 and a mudflow wellbore telemetry device 38 (hereinafter "telemetry device 38"). The electronic sensor package 36 of the tool 34 may detect and/or measure the one or more characteristics and/or properties of the wall 30 of the wellbore, the underground formation 18, and/or the drill string 14. The telemetry device 38 of the tool 34 may communicate with a surface system processor 50 (hereinafter "processor 50") located at the Earth's surface 29 via mud pulse telemetry, acoustic telemetry, electromagnetic telemetry, wire-drill pipe telemetry and/or real time bidirectional drill string telemetry. It should be understood that the type of telemetry utilized by the telemetry device 38 may be any type of telemetry capable of communicating with the processor 50 as known to one of ordinary skill in the art.

For example, the telemetry device 38 may be a mud pulse telemetry system which may be classified as one of two types of mud pulse telemetry systems which depend upon the type of pressure pulse generator being used, although "hybrid" mud pulse telemetry systems have also been disclosed. A first type of mud pulse telemetry system may utilize a valving "poppet" system to generate a series of either positive or negative, and essentially discrete, pressure pulses which are digital representations of data and/or information. A second type of mud pulse telemetry system, an example of which is disclosed in U.S. Pat. No. 3,309,656, incorporated herein be reference in its entirety, may utilize a rotary valve or a "mud siren" pressure pulse generator which may repeatedly interrupt the downward flow of the drilling mud 20 in the drill string 14, and thus may cause varying pressure waves or pulses to be generated in the drilling mud 20 at an acoustic carrier frequency that is proportional to a rate of interruption. The data, information and/or one or more measurements may be detected and/or collected by the one or more sensors 36 may be transmitted, in real-time, from the BHA 33 to the Earth's surface 29 by modulating the acoustic carrier frequency. A related design is that of the oscillating valve, as disclosed in U.S. Pat. No. 6,626,253, incorporated herein by reference in its entirety, wherein the rotor oscillates relative to stator, changing directions every 180 degrees, repeatedly interrupting the downward flow of the drilling mud 20 and causing varying pressure waves or pulses to be generated which are representative of data, information and/or one or more measurements.

The telemetry device 38 may be utilized to modulate pressure pulses and/or pressure signals in the drilling mud 20 to transmit data, in real-time, from the sensor package 36 to the Earth's surface 29. Modulated changes in the pressure of the drilling mud 20 may be detected by a pressure transducer 40 and a pump piston sensor 42, both of which may be coupled to the processor 50. The processor 50 may interpret the modulated changes in the pressure of the drilling mud 20 to reconstruct, recalculate and/or decompressed the data collected and sent by the sensor package 36. As a result, the processor 50 may process and decompress the data to obtain the one or more characteristics and/or properties associated with the underground formation 18. The modulation and demodulation of a pressure wave are described in detail in commonly assigned U.S. Pat. No. 5,375,098, which is incorporated by reference herein in its entirety.

The one or more measurements associated with the underground formation 18 may be collected by the sensor package 36 and may include a larger amount of data. The large amount of data associated with the one or more measurements may be compressed before the pressure pulses are modulated by the telemetry device. The large amount of data associated with the one or more measurements may be compressed via one or more data compression techniques. The one or more data compression techniques may be executed downhole at the BHA 33 or, for example, by a processor (not shown in the drawings) or a compressor 60 (see FIG. 3) of the tool 34 to compress the measurements, data and/or information collected downhole before the compressed data is transmitted uphole by the telemetry device 38. Software and/or one or more computer programs may be stored in a storage medium of the tool 34 which may be executed by the tool 34 to compress the measurements, data and/or information collected downhole before transmitting the compressed data uphole to the Earth's surface 29. For example, U.S. Pat. No. 6,405,136, which is incorporated by reference herein in its entirety, describes data compression techniques for communication between wellbore measuring instruments and surface recording systems.

The tool 34 may collect and/or detect the one or more downhole measurements, data and/or information (hereinafter "data") associated with the underground formation 18. The compressor 60 of the tool 34 may execute the software and/or the one or more computer programs stored in the storage medium of the tool 34 to compress the data into compressed data. As a result, the systems and methods of the present invention may compress the one or more measurements collected by the tool 34 into a smaller quantity of data. After the compressed data is generated by the tool 34, the compressed data may be transmitted uphole from the tool 34 to the processor 50 at the Earth's surface via the drilling mud 20 and/or the telemetry device 36. The compressed data may be decompressed and/or processed at the Earth's surface by the processor 50 or a processor (not shown in the drawings) which may be located locally or remotely with respect to the drilling system 1, the drill string 14, the BHA 33, the tool 34, the telemetry device 36 and/or the processor 50.

The decompressed data may be processed to reconstruct the one or more measurements associated with the underground formation 29 which may have been collected downhole via the tool 34. The one or more measurements detected by the tool 34 may provide the one or more operators at the Earth's surface based on the reconstructed measurements. For example, the reconstructed measurements may be time-based measurements which may provide, in real-time, the operators with characteristics and/or properties associated with the underground formation 29 to conduct and/or perform drilling operations. The characteristics and/or properties associated with the underground formation 29 may include, for example, porosity, permeability, free-fluid volume, bound-fluid volume (hereinafter "BFV"), pore size, pore size distribution, water saturation, wettability, mineralogy-independent porosity. The properties may accurately characterize the underground formation 18 without use of radioactive sources as well as direct detection of the presence of hydrates and/or identification of fluids present. The characteristics and/or properties obtainable by the tool 34 via the one or more time-based measurements may include any parameters as known to one of ordinary skill in the art.

In embodiments, the one or more time-based measurements detected by the tool 34 may include a nuclear magnetic resonance signal decaying time (hereinafter "NMR $T_2$") distribution waveform measurement of the underground formation 29. The term "waveform" may refer to a shape of a signal moving in a medium, such as a solid, liquid and/or gaseous medium or a shape of a graph of varying quantity against time and/or distance. Permeability of formation fluid, porosity, pore size estimations and/or distribution of formation porosity for the underground formation 18 may be determined, calculated, recomputed, reconstructed and/or identified based on the NMR $T_2$ distribution waveform measurement. Further, a lithology-independent porosity for the underground formation 18 may be determined, calculated, recomputed, reconstructed and/or identified based on a total integral of the NMR $T_2$ distribution waveform measurement. Still further, the BFV for the underground formation 18 may be determined, calculated, recomputed, reconstructed and/or identified by integrating the NMR $T_2$ distribution waveform measurement from starting decaying time to the cut-off position. Moreover, many other characteristics and/or properties of the underground formation 18 may be determined, calculated, recomputed, reconstructed and/or identified based on the NMR $T_2$ distribution waveform measurement as known by one of ordinary skill in the art.

The systems and methods of the present invention for compressing data in borehole communication between the tool 34 and the processor 50 may incorporate a lossy compression technique. The lossy compression technique may compress the data by transform coding and/or perceptual coding which may discard some or a portion of the data collected downhole by the tool 34 to generate the compressed data for uphole transmission. In embodiments, data compression may refer to encoding the data by using fewer bits than may be used by an unencoded representation of the data. When the compressed data and/or measurements is decompressed at the Earth's surface, the recovered and/or reconstructed data and/or measurements may be the same or substantially the same as the data and/or measurements originally collected downhole by the tool 34.

In embodiments, the systems and methods may include at least a discrete fourier transform (hereinafter "DFT") or a discrete cosine transform ("DCT"), a significant coefficient selector, an adaptive quantization and/or a dynamically-switchable entropy encoder. The DFT may analyze one or more frequencies of a signal, solve one or more partial differential equations and/or may perform operations, such as, for example, multiplying large integers. The adaptive quantization may approximate a continuous range of values by a relatively small set of discrete symbols or integer values. The dynamically-switchable entropy encoder may utilize and/or execute an entropy encoding technique, such as, for example, Huffman coding, signed magnitude coding, run-length coding, delta modulation, arithmetic coding, Elias gamma coding, Fibonacci coding, unary coding, Rice coding and/or the like. It should be understood that the entropy encoding technique of the dynamically-switchable entropy encoder may be any entropy encoding technique as known to one of ordinary skill in the art.

The data compression technique of the embodiments described herein may be combined with other data compression techniques to further enhance the compression and transmission of data being sent uphole from the tool 34 to the processor 50. The other data compression techniques that may be combined with the systems and methods of the present invention may be any data compression techniques as known to one of ordinary skill in the art.

For example, the system and method of the present invention for compressing data may compress one or more time-based measurements, such as, a 16-bin NMR $T_2$ distribution waveform measurement into 36 bits with acceptable errors. Transmission of the compressed data or the one or more time-based measurements (hereinafter "compressed data"), such as, for example, the compressed NMR $T_2$ distribution waveform uphole from a tool 34 via the drilling mud 20 and/or the telemetry device 36 may require a large amount of bandwidth. As a result, a data compression ratio of, for example, about 2.0 fold to about 3.0 fold may be required and/or preferred to effectively and/or efficiently transmit the compressed data uphole via the drilling mud 20 and the telemetry device 36.

After the compressed data is received at the Earth's surface and decompressed to generate and/or reconstruct the reconstructed data and/or one or more time-based measurements (hereinafter "reconstructed data"), the processor 50 may be capable of computing, determining, detecting and/or accessing, in real-time, the one or more measurements, data and/or information collected downhole via the compressed data transmitted through the drilling mud 20. As a result, the processor 50 may generate the reconstructed data based on the decompression of the compressed data received from the tool 34. The reconstructed data accessed and/or recovered by the processor 50 may be the same or substantially the same shape and/or value as a shape and/or value of the data original collected downhole by the tool 34. As a result, the one or more operators at the Earth's surface may make drilling decisions, in real-time, based on the reconstructed data. Alternatively, the reconstructed data may be processed, in real-time, to obtain one or more characteristics and/or properties associated with the underground formation 18. As a result, the one or more operators at the Earth's surface may make drilling decisions, in real-time, based on the one or more characteristics and/or properties associated with the underground formation 18 calculated from the reconstructed data (hereinafter "calculated properties of the underground formation 18").

In order for the one or more operators to effective and/or efficiently utilize, recomputed and/or reconstructed the data and/or measurements collected downhole by the tool 34, in real-time, to make real-time drilling operation decisions, the reconstructed data and/or calculated properties of the underground formation 18 must incorporate either no error, only minimal error, predetermined or acceptable error. For example, when compared to the time-based measurement, such as, a NMR $T_2$ distribution waveform measurement originally collected downhole by the tool 34, the reconstructed data, such as, a reconstructed NMR $T_2$ distribution waveform measurement may have a predetermined error or less than a predetermined error. Further, the reconstructed data, such as, NMR $T_2$ distribution waveform measurement may allow for calculation of the calculated properties of the underground formation 18, such as, the calculated porosity and/or BFV of the underground formation 18 at the Earth's surface such that the calculated porosity and/or BFV may have at most the predetermined error. In embodiments, the calculated properties of the underground formation 18 may be the same or substantially the same as the properties of the underground formation 18 may be calculated from the data and/or measurements original detected downhole by the tool 34. The predetermined error associated with the reconstructed data may be based the types of data collected by the tool 34, the real-time drilling operation decisions to be made and/or needs of the one or more operators of the drilling system 1.

When compared to the time-based measurements, such as, a NMR $T_2$ distribution waveform measurement originally obtained downhole by the tool 34, the reconstructed data, such as, a reconstructed NMR $T_2$ distribution waveform measurement may substantially maintain shape such that a quality check may be conducted by the one or more operators of the drilling system 1. Further, a calculated property of the underground formation 18 based on, for example, a reconstructed NMR $T_2$ distribution waveform measurement may not have more than the predetermined error. Still further, a calculated property of the underground formation 18, such as, for example, a calculated BFV of the underground formation 18 may not have an error of more than the predetermined error. For example, the compression of the data should cover a data range for porosity of less than about 100 porosity unit (hereinafter "pu"), such as, about 0-56 pu. In formation evaluation, the phrase "porosity unit" may refer to a unit equal to a percentage of pore space in a unit volume of rock or formation and may have a value between 0 and 100.

In embodiments, the lossy compression technique may be a transform-based compression technique. FIG. 2 illustrates a first type curve (I) for a first NMR $T_2$ distribution waveform measurement (hereinafter "first waveform") and a second type curve (II) for a second NMR $T_2$ distribution waveform measurement (hereinafter "second waveform"). Ideally, the first and second waveforms may be slow-varying curves (I, II) with a few peaks, such as, for example, one peak or two peaks. The curves (I, II) may have or show better or higher energy compaction in a frequency domain when compared to the energy compaction in the time domain because "slow-variation" in curves (I, II) may push energy to a low frequency region in the frequency domain. Given a predetermined number of bits representing the compressed waveform, the lossy compression technique may take advantage of the energy compaction, such as by allocating more bits to represent power strength and/or allocating fewer bits to encode positions where major power components may be located.

FIG. 3 illustrates a system 300 for borehole communication in embodiment of the present invention. The system 300 may be configurable at the Earth's surface by the one or more operators which may be referred to as "surface configuration 56". In embodiments, a downlink communication 58 may be transmitted downhole from the Earth's surface to the tool 34 and/or the system 300 in the wellbore via the drilling mud 20. As a result, the tool 34 and/or the system 300 may be controlled, changed and/or configured via the surface configuration 56 and/or the downlink communication 58. Configuration of the tool 34 and/or the system 300 may adjust and/or change one or more parameters associated with the tool 34 and/or the system 300 which may control and/or change data compression achievable by the tool 34. In embodiments, the changeable and/or controlable parameters of the system 300 may include a number of frames and/or scans, a compression ratio, a compression rate and/or a transmission rate. It should be understood that the one or more parameters of the tool 34 and/or the system 300 that may be changed, controlled and/or configured may be any parameter known to one of ordinary skill in the art and/or the predetermined characteristic may be any predetermined characteristic known to one of ordinary skill in the art.

The sensor package 36 of the tool 34 may obtain and/or detect the data and/or measurements associated with the underground formation 18. The data may be transmitted to a data compressor 60 (hereinafter "compressor 60"). In embodiments, the compressor 60 may be configured by the surface configuration 56 by the one or more operators and/or by the downlink communication 58 as shown in FIG. 3. The compressor 60 may receive the downlink communication 58 via the drilling mud 20. As a result, the compressor 60 may be controlled and/or configured via the surface configuration 56 and/or the downlink communication 58. Configuration of the compressor 60 may adjust, control and/or change the one or more parameters of the tool 34 and/or the compressor 60. In embodiments, the one or more parameters of the compressor 60 may include parameters associated with lossy compression techniques, such as, for example, a number of significant coefficients to be selected from components of a domain. It should be understood that the one or more parameters of the compressor 60 that may be controllable, changeable and/or configurable may be any parameters associated with the compressor 60 or with lossy compression techniques as known to one of ordinary skill in the art.

The compressed data may be transmitted to the telemetry device 38 of the tool 34, and the pressure transducer 40 at the Earth's surface 29 may receive the compressed data via the drilling mud 20. The pressure transducer 40 may transmit the compressed data to a decompression module 62 which may decompress and/or reconstruct the compressed data to obtain the reconstructed data. The decompression module 62 may be incorporated into or separate and/or independent from the processor 50. Alternatively, the processor 50 may access the compressed data and/or may decompress and reconstruct the compressed data to obtain the reconstructed data. The reconstructed data may be subsequently accessed, in real-time, by one or more of the operators at the Earth's surface to be utilized for one or more real-time drilling operation decisions.

After the tool 34 may obtain and/or collect the data via the sensor package 36 in the wellbore, the compressor 60 may apply DFT to convert a time-based waveform for the data into a power spectrum in the frequency domain. The frequency domain components of the power spectrum with largest amplitudes may be referred to as significant coefficients. By analyzing the power spectrum, the compressor 60 may select a list of most significant coefficients from the frequency domain components which may be possibly included in an available bandwidth. As a result, the compressor 60 may generate selected coefficients from the list of the most significant coefficients. The selected coefficients may be quantized using an adaptive quantization technique and encoded into compressed data and/or a bit-stream by a dynamically-switchable entropy encoder, such as for example, a Huffman encoder, a signed magnitude encoder, an arithmetic encoder and/or the like. The compressed data may become a bit-stream, such as for example, a 36-bit bit-stream which may be transmittable to the Earth's surface 29 using at least one compressed DPOINT via the drilling mud 20 and/or the telemetry device 38. The term "DPOINT" refers to a basic entity of data transmitted at real-time while drilling by the telemetry device 38. In other words, a DPOINT refers to a collection of a variable number of bits and may be dependent on specific LWD and/or MWD applications and/or measurements associated with the specific LWD and/or MWD applications. For example, a DPOINT may contain one or more samples measure by one or more downhole tools. In embodiments, the compressed data may be transmitted to the Earth's surface 29 using a number of DPOINTS, such as, DPOINT #1, DPOINT #2 and DPOINT #3 (collectively referred to hereinafter "DPOINTS #1-3"). It should be understood that the number of DPOINTS utilized to transmit compressed data to the Earth's surface 29 may be any number of DPOINTS as known to one of ordinary skill in the art.

A decompression module 62 may be incorporated into the processor 50 at the Earth's surface. The decompression module 62 may include and/or implemented in software and/or one or more computer programs for decompressing and/or reconstructing the compressed data received via the drilling mud 20. After the decompression module 62 receives the compressed data including the DPOINTS, the decompression module 62 may execute a decompression technique which may be the same or substantially the same reversed method as the method of compressing data.

Figure 4:
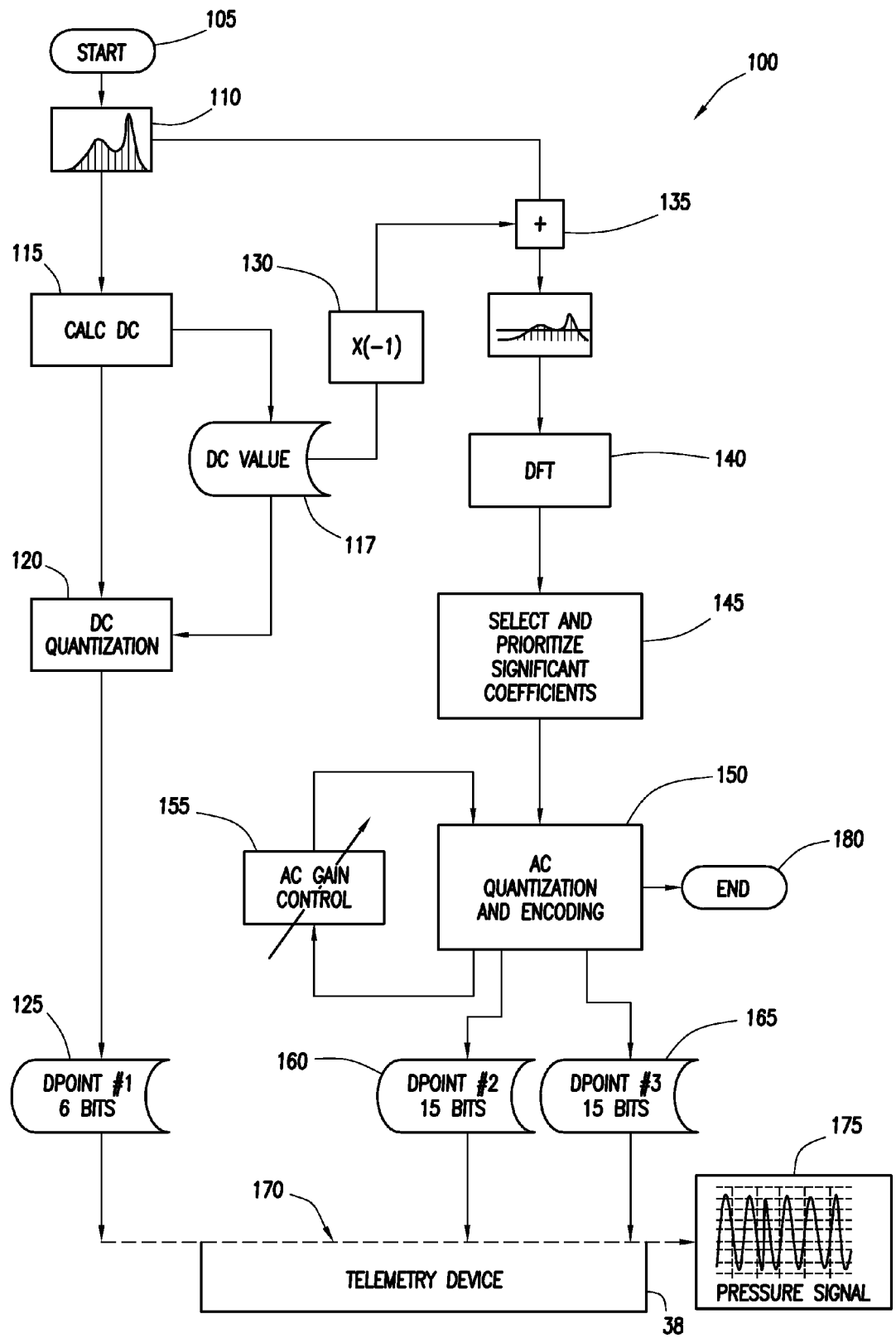
FIG. 4 illustrates a flow chart of a method for compressing data in an embodiment of the present invention.

In embodiments, a method 100 of compressing data according to the present invention may be illustrated in FIG. 4. The method for compressing data may be executed and/or initialized by the tool 34 as shown at step 105. The tool 34 may collect and/or obtain data one or more time-based measurements, such as, for example, a NMR $T_2$ distribution waveform measurement as shown at step 110. The method 100 of compressing data may calculate a DC value of the one or more time-based measurements. For a given original time-based measurement, such as, for example, an original NMR $T_2$ distribution waveform measurement of 16 bins:

$$x(n)=x_0, x_1, \ldots x_{15} \quad (1)$$

As shown at step 115, the DC value may be calculated:

$$\bar{x} = \frac{\sum_{n=0}^{15} x_n}{16} \quad (2)$$

As a result, the DC value may be generated as shown at step 117. A range of DC value may be, for example, about 0-3.5 pu because a porosity compression range may be, for example, about 0-56 pu. As shown at step 120, the DC value may be quantized using linear quantization:

$$I_{dc}=\text{round}(\bar{x} \cdot 63/3.5) \quad (3)$$

The quantized DC value may generate DPOINT #1 which may contain, for example, (6) six bits as shown at step 125. As a result, a quantization accuracy of, for example, about 0.055 pu may be achieved.

After the DC value may be calculated, the DC value may be removed from the original measurement as shown at step 130, resulting in a DC-subtracted measurement, as shown at step 135. In embodiments, the DC-subtracted measurement may be, for example, a DC-subtracted waveform:

$$y(n)=\{x_0, x_1, \ldots x_{15}\}-\bar{x} \quad (4)$$

As shown at step 140, a DFT may be applied to the waveform y(n):

$$Y(k) = \frac{1}{N}\sum_{n=0}^{N-1} y_n e^{-\frac{2\pi i}{N}kn}, \quad (5)$$

where k=0, 1, . . . , N−1, may be frequency domain indices, and N=16, may be a length of the waveform. Since y(n) may be real numbers, the DFT may obey the symmetry:

$$Y(k)=Y^*(N-k), \quad (6)$$

where * may denote a complex conjugate. Therefore, the above DFT results may be half redundant, for example, a second half of DFT coefficients may be derived from a first half of the DFT coefficients. A waveform length may be an even number, such as, for example sixteen (16) because the DC value may be removed before execution of the DFT. As a result, there may become, for example, exactly N independent real numbers of AC coefficients, such as, for example (15) fifteen independent real numbers of AC coefficients:

Re($Y_1$), Im($Y_1$), Re($Y_2$), Im($Y_2$), Re($Y_3$), Im($Y_3$), Re($Y_4$), Im($Y_4$), Re($Y_5$), Im($Y_5$), Re($Y_6$), Im($Y_6$), Re($Y_7$), Im($Y_7$), and Re($Y_8$).

These independent AC coefficients may be stored in an array in the above order. It should be understood that the N independent real numbers may be any number as known to one of ordinary skill in the art.

A compression quality may highly rely on distribution of a power distribution of the AC coefficients and a predetermined number of significant coefficients that may be included in the compressed results and/or the compressed data. Improved compression performance may be achieved by sending more significant coefficients with less bandwidth.

In embodiments, it has been surprisingly found that sufficient and/or necessary compression requirements may be achieved by normally requiring a predetermined number of significant AC coefficients selected from a larger number of AC coefficients to be included in the compressed DPOINTS and/or the compressed data. For example, the predetermined number of significant AC coefficients may be six (6) or more AC coefficients and the larger number of AC coefficients may be eleven (11) AC coefficients. Accordingly, a coefficient selector may be designed for the data compression and/or the compressor 60 to select the predetermined number of significant coefficients from the larger number of AC coefficients and zero-off insignificant AC coefficients at positions lower than the position of the last significant coefficient of the predetermined number of significant coefficients. As a result, the coefficient selector may select and prioritize a predetermined number of significant coefficients as shown at step 145 in FIG. 4. The predetermined number of significant coefficients may be defined by and/or based on an application associated with the original data, the measurements obtained by the tool 34, a desired quality associated with the decompressed data, reconstructed data and/or recomputed measures, and/or an available amount of bandwidth. The predetermined number of significant coefficients may be any number of significant coefficients as known to one of ordinary skill in the art and/or may be defined by and/or based on any method and/or techniques as known to one of ordinary skill in the art.

An entropy coding technique which may be executed by the dynamically switchable entropy encoder may be a variable-length coding scheme. As a result, a predetermined number of significant coefficients which may be coded in a fixed number of bits may be variable. Thus, it has been found surprising and unexpected to prioritize the predetermined number of significant coefficients in an order of coding sequence.

By the method of data compression according to the present invention, it is found surprisingly and unexpectedly that, for example, 36 bits (including the 6 bits used for the DC value) can achieve the sufficient and/or necessary data compression. For example, the use of 36 bits per NMR $T_2$ distribution waveform measurement may surprisingly and unexpectedly include, on average, for example, about 6.6 significant coefficients. An adaptive quantization and encoding technique may be provided to apply high quality quantizers and/or encoders to the one or more measurements, data and/or information, such as, for example, the NMR $T_2$ distribution waveform measurement as shown at step 150.

The quantization and encoding technique may include, provide and/or incorporate the AC Gain Control shown at step 155 in FIG. 4. At least two types of quantization seeds and encoders may be included and/or provided by the systems and methods for compressing data according to the present invention. For example, the systems and methods of the present invention may include and/or provide a first encoder type and a second encoder type.

The first encoder type 1 may utilize first Huffman codes for $C^q(l)$ except last coefficients encoded within 36 bits. The first encoder type may be designed to cover a data range from about −7 to about 7 which may be based on a probability of occurrences for each value. A 4-bits signed-magnitude encoder may be utilized for the last coefficients encoded within the 36 bits. The quantization seeds and the encoder for the first encoder type surprisingly and unexpectedly perform effectively and/or efficiently when utilized with the first NMR $T_2$ distribution waveform having the first type curve (I) as shown in FIG. 2. The first NMR $T_2$ distribution waveform may provide better power compaction in the low frequency area but the coefficients may have a large dynamic range.

The second encoder type may utilize second Huffman codes except last coefficients encoded within 36 bits. The second encoder type may be designed to cover a data range from about −3 to about 3 which may be based on a probability of occurrences for each value. A 3-bits signed-magnitude encoder may be utilized for the last coefficients encoded within the 36 bits. The quantization seeds and the encoder for the second encoder type surprisingly and unexpectedly perform effectively and/or efficiently when, for example, utilized with the second NMR $T_2$ distribution waveform having the second type curve (II) as shown in FIG. 2. The first NMR $T_2$ distribution waveform may provide better power compaction in the low frequency area but the coefficients may have bigger dynamic range. Thus, when compared to the first NMR $T_2$ distribution waveform having the first type curve (I), the second NMR $T_2$ distribution waveform having the second type curve (II) may have wider power spectrum, but the coefficients may have smaller dynamic range.

The quantization and encoding technique of the present invention may be an iterative method which may include one or more combinations of the first encoder type, the second encoder type and (4) four types of AC Gain Control (hereinafter "AGC") values. Three bits may be allocated to notify the decompression module, located at the Earth's surface, of the AGC value and whether the first encoder type or the second encoder type was used in generation of the compressed data at the compression end.

The quantization and encoding technique according to the present invention may generate DPOINT #2 which may contain, for example, fifteen (15) bits as shown at step 160. Moreover, the quantization and encoding technique according to the present invention may generate DPOINT #3 which may contain, for example, fifteen (15) bits as shown at step 165.

The method 100 for compressing data may generate and/or produce the compressed data which may include, for example, 36 bits based on, derived from and/or correspond to DPOINTS #1-3. The compressed data including DPOINTS #1-3 may be received by the telemetry device 38 as shown at step 170, and the telemetry device 38 may modulate and/or transmit the compressed data uphole as a pressure signal in the drilling mud 20 to the Earth's surface 29 as shown at step 175. Moreover, the method 100 may be terminated or end as shown at step 180.

Figure 5:
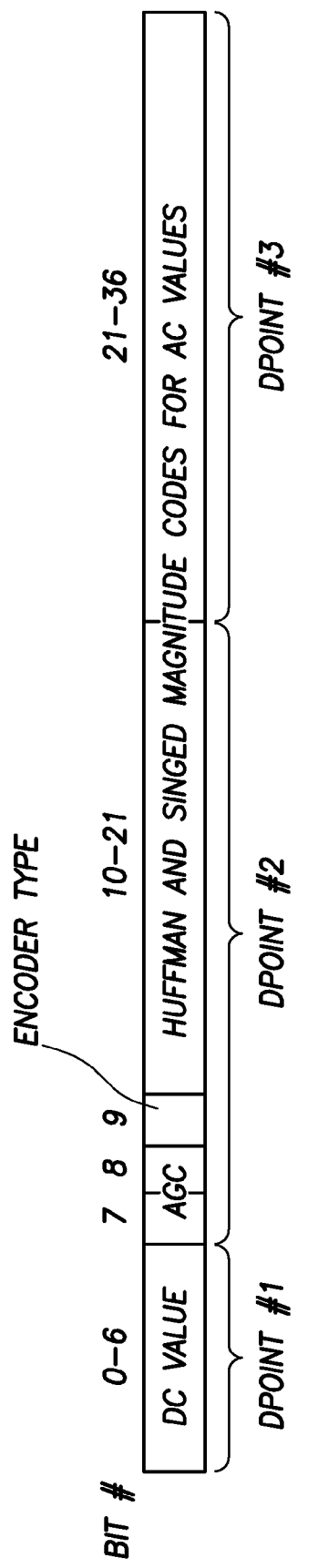
FIG. 5 illustrates a compression DPOINTS bit layout for a NMR $T_2$ distribution waveform measurement in an embodiment of the present invention.

The compressed data may have a final bit layout as shown in FIG. 5. In embodiments, the final bit layout may include the six (6) bits of DPOINT #1, the fifteen (15) bits of DPOINT #2 and the (15) fifteen bits of DPOINT #3. For example, the fifteen (15) bits of DPOINT #2 may include the two (2) bits for the AGC value and the one (1) bit for the first encoder type or the second encoder type.

Figure 6A:
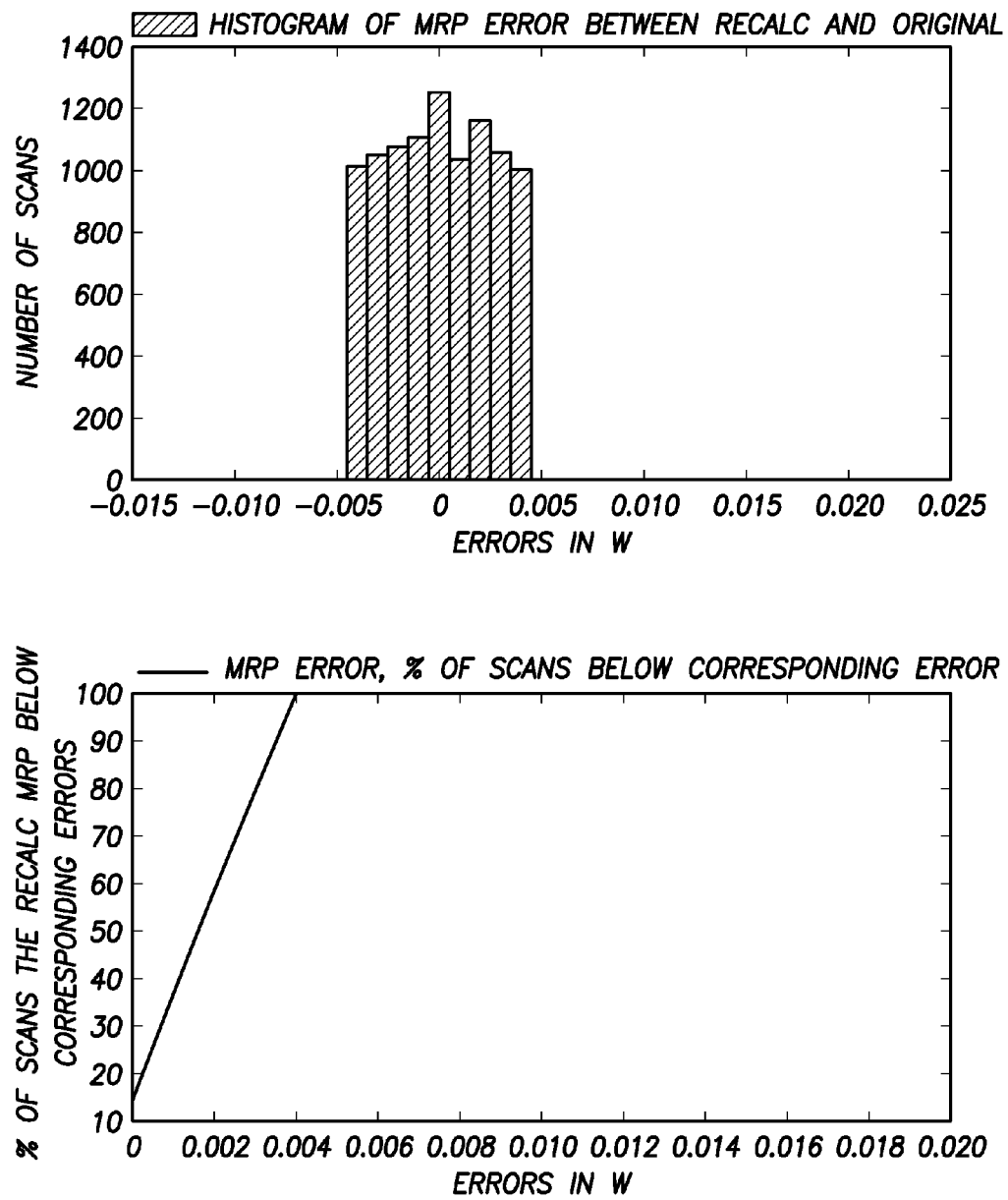
FIG. 6 illustrates graphs for errors for porosity and bound fluid volume (hereinafter "BFV") computed from a NMR $T_2$ distribution waveform measurement obtained from recovered data in an embodiment of the present invention.
Figure 6B:
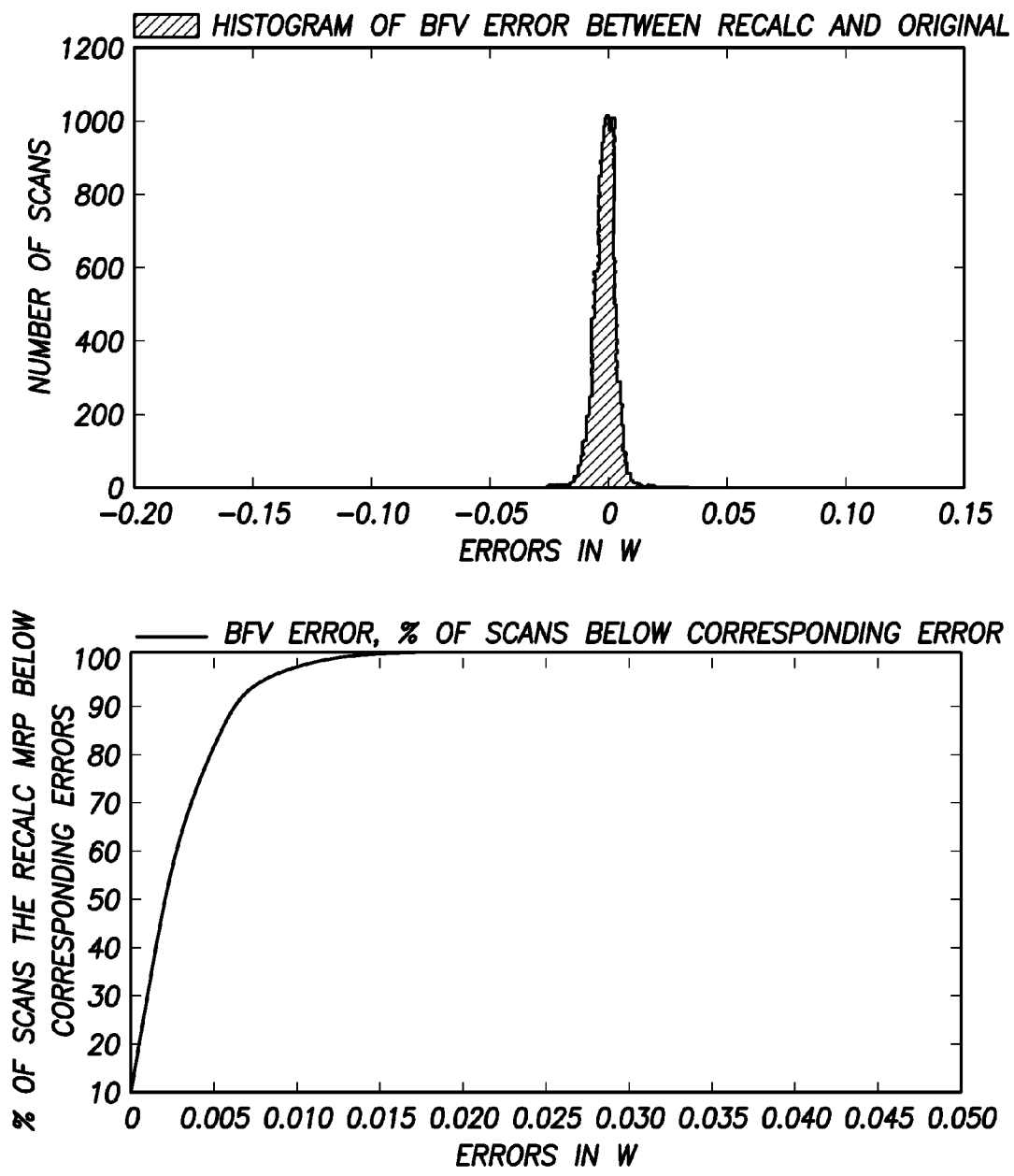

The one or more time-based measurements collected by the tool 34, such as, for example, the 16-bin NMR $T_2$ distribution waveform measurements may be positive values. However, the method for compressing data according to the present invention may generate a negative value on one or more specific bins either due to a quantization error and/or Gibbs phenomenon. FIG. 6 illustrates errors for the calculated properties of the underground formation 18, such as, porosity and BFV based on the reconstructed data, such as, a reconstructed NMR $T_2$ distribution waveform measurement based on decompression of the compressed data via the decompression module 62. Therefore, execution of at least one correction technique by the decompression module 62 and/or the processor 50 may be necessary and/or preferred after decompression of the compression data at the Earth's surface 29.

For a correction technique, the following variables, for example, may be defined:

$\bar{\phi}$ which may be a reconstructed DC value recoverable from DPOINT #1; and $\tilde{x}(n)$ which may be a reconstructed time-based measurement, such as, for example a NMR $T_2$ distribution waveform measurement but before applying one corrections to the recovered data. The reconstructed time-based measurement may include one or more negative values for one or more specific bins. Examples of the one or more negative values may include the following:

$\underline{x}(n)$ which may be a waveform derived of $\tilde{x}(n)$ with one or more negative bins which may be truncated to zero; and $\hat{x}(n)$ which may be a corrected waveform.

Applying the at least one correction technique to the reconstructed time-based measurement may involve at least the two following steps. For each n=0, 1, . . . , 15

$$\underline{x}(n) = \begin{cases} \tilde{x}(n), & \tilde{x}(n) > 0 \\ 0 & \tilde{x}(n) \leq 0 \end{cases} \quad (7)$$

$$\hat{x}(n) = \underline{x}(n) \cdot \frac{16 \cdot \bar{\phi}}{\sum_{k=0}^{15} \underline{x}(k)} \quad (8)$$

By executing the at least one correction technique, the decompression module 62 and/or the processor 50 may prevent negative values and/or negative bins from being included within the reconstructed time-based measurements. Further, by executing the at least one correction technique, reconstruction of the one or more time-based measurements the processor 50 at the Earth's surface 29 may be surprisingly and unexpectedly more accurate. Moreover, by executing the at least one correction technique, calculating the calculated properties associated with the underground formation 18, such as, for example, the porosity and/or the BFV of the underground formation 18 may be surprisingly and unexpectedly more accurate.

Figure 7A:
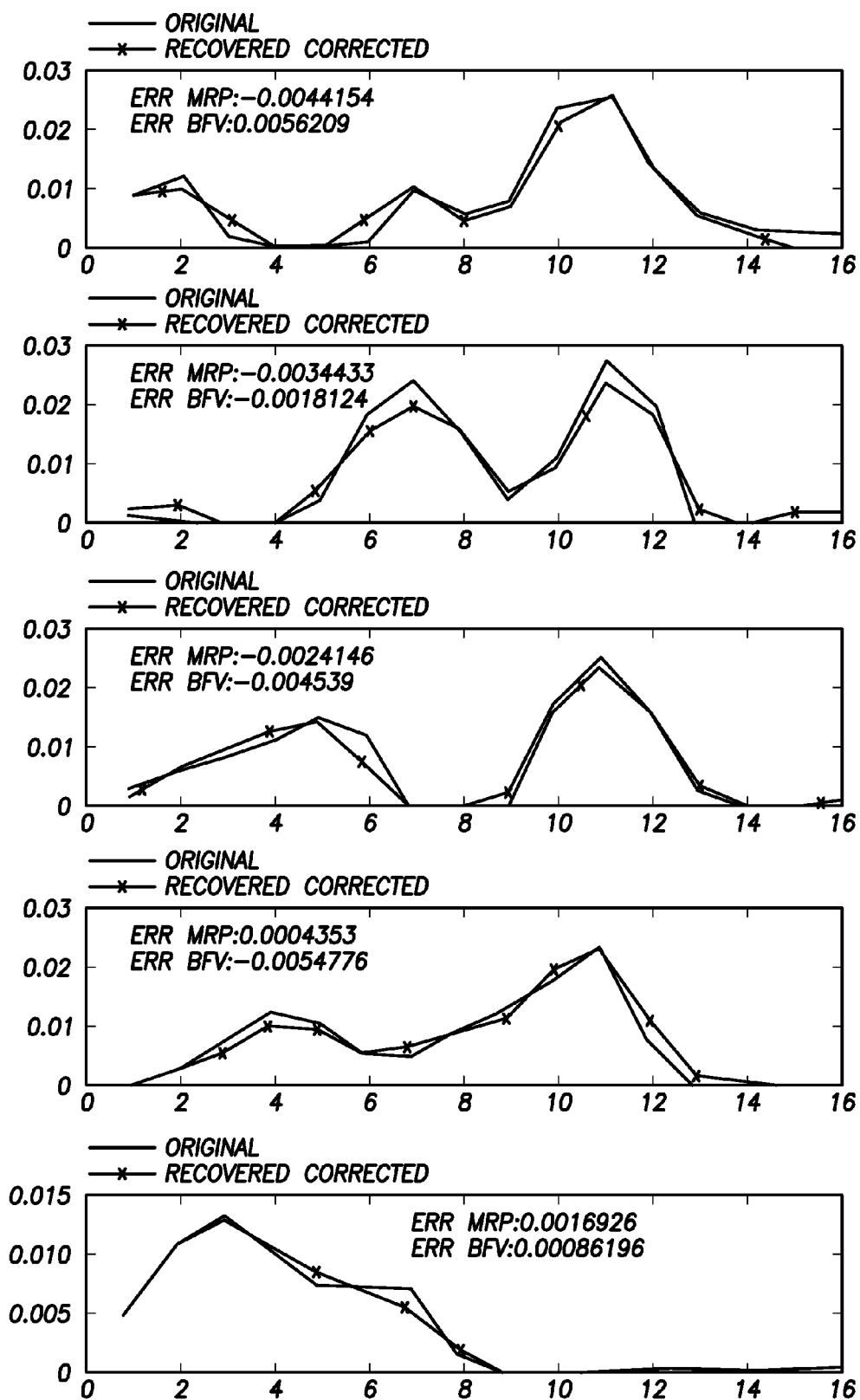
FIG. 7 illustrates a graphical comparison between original NMR $T_2$ distribution waveform measurements obtained downhole by a tool and recovered NMR $T_2$ distribution waveform measurements obtained from recovered data in an embodiment of the present invention.
Figure 7B:
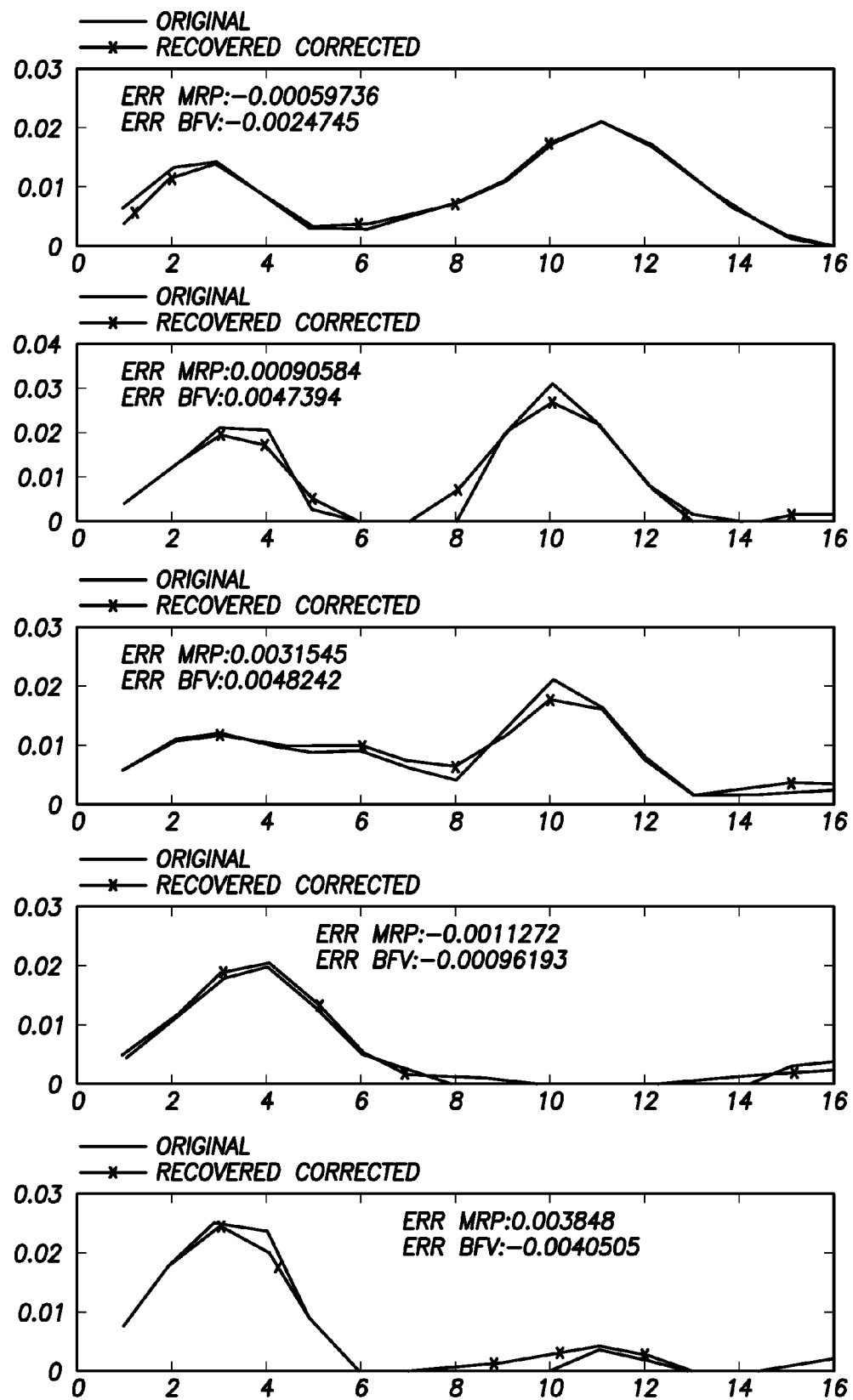

An experiment was conducted by utilizing reconstructed time-based measurements, such as, for example, two datasets having a total of 9742 scans of NMR $T_2$ distribution waveform measurements. Original measurements collected downhole by the tool 34 and reconstructed time-based measurements obtained by decompression of compressed data for the original time-based measurements are identified in the graphs of FIG. 7. As shown by the results of FIG. 7, the reconstructed time-based measurements obtained from decompression of the compressed data surprisingly and unexpectedly may match, may be the same as or may be substantially the same as the original time-based measurements collected downhole by the tool 34. Computed properties of the underground formation 18, such as, for example, porosity values from the reconstructed time-based measurements are surprisingly and unexpectedly within a predetermined error of, for example, about +/−0.4 pu when compared to the calculated properties of the underground formation 18 based on the original time-based measurements. As shown in FIG. 7, for 97.8% of the scans of the two data sets, computed BFV values from the reconstructed time-based measurements are surprisingly and unexpectedly within a predetermined error of, for example, about +/−1.0 pu when compared to computed BFV values from the original time-based measurements.

The systems and methods for compressing data according to the present invention achieves the necessary and preferred compression of original time-based measurements collected downhole by the tool 34 for transmission uphole via the drilling mud 20 and/or the telemetry device 38. By combining the DFT, the significant coefficient selector, the adaptive quantization, and the dynamic-switchable entropy encoder, the systems and methods of the present invention may be capable of compressing the original time-based measurements, such as, for example, a 16-bin NMR $T_2$ distribution waveform measurement into compressed data having, for example, 36 bits and only including an acceptable range of the predetermined error. Further, the experimental results shown in FIG. 7 illustrates that recalculations of calculated properties of the underground formation 18 based onto the reconstructed time-based measurements at the Earth's surface may be surprisingly and unexpectedly within the predetermined error range when compared to calculations based on the original time-based measurements collected downhole by the tool 34.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A method for compressing data, the method comprising of:
   converting original data collected by a sensor from a first domain into a second domain, wherein the original data is associated with one or more properties of an underground formation;
   selecting a predetermined number of significant coefficients from components of the second domain, wherein the predetermined number of significant coefficients are components of the second domain with largest amplitudes;
   quantizing the selected predetermined number of significant coefficients via a quantization technique; and
   encoding the selected predetermined number of significant coefficients into compressed data via an encoder.

2. The method according to claim 1, wherein the original data comprises one or more time-based measurements.

3. The method according to claim 2, wherein the one or more time-based measurements comprises one or more nuclear magnetic resonance measurements.

4. The method according to claim 3, wherein the one or more nuclear magnetic resonance measurements comprises at least one NMR T2 distribution waveform measurement.

5. The method according to claim 1, further comprising:
   transmitting the compressed data uphole to a processor via a telemetry device.

6. The method according to claim 5, further comprising:
   reconstructing the original data based on the compressed data to provide reconstructed data.

7. The method according to claim 6, further comprising:
   applying a correction technique to the reconstructed data to produce corrected data within a predetermined range of error.

8. The method according to claim 7, further comprising:
   calculating the one or more properties associated with the underground formation based on the reconstructed data or the corrected data.

9. The method according to claim 8, wherein the one or more properties associated with the underground formation comprises porosity or bound fluid volume of the underground formation.

10. The method according to claim 1, further comprising:
    changing the predetermined number of significant coefficients based on a downlink communication.

11. A method for compressing and reconstructing data via borehole communication, the method comprising of:
    providing a drill string having a bottom hole assembly, a downhole tool associated with the bottom hole assembly and comprising a sensor, wherein the drill string is located within a wellbore, the downhole tool is configured to provide borehole communication via a telemetry device, and the sensor is configured to collect original data associated with one or more properties of an underground formation, wherein the original data comprises one or more time-based measurements;
    compressing the original data to generate compressed data via a lossy compression technique from a first domain to a second domain;
    transmitting the compressed data uphole to a processor via the telemetry device; and
    reconstructing the one or more time-based measurements to generate one or more reconstructed time-based measurements, wherein the one or more reconstructed time-based measurements are based on the compressed data received from the telemetry device.

12. The method according to claim 11, wherein the one or more time-based measurements comprises at least one NMR $T_2$ distribution waveform measurement.

13. The method according to claim 11, wherein the telemetry device is a mud pulse telemetry device, wired drill pipe, an electromagnetic telemetry device or an acoustic telemetry device.

14. The method according to claim 11, further comprising:
    applying a correction technique to the reconstructed data to produce corrected data within a predetermined range of error.

15. The method according to claim 11, further comprising:
    calculating the one or more properties associated with the underground formation based on the reconstructed data.

16. The method according to claim 15, wherein the one or more properties associated with the underground formation comprises porosity or bound fluid volume of the underground formation.

17. A method for controlling data compression in borehole communication, the method comprising:
    providing a lossy compressor associated with a bottom hole assembly of a drill string located within a wellbore;
    transmitting a downlink communication to the lossy compressor via a telemetry device;
    changing at least one parameter associated with the lossy compressor based on the downlink communication; and
    compressing original data to generate compressed data via the lossy compressor, wherein the original data comprises one or more time-based measurements that are based on one or more properties associated with an underground formation, wherein the compressed data is generated based on the at least one parameter of the lossy compressor.

18. The method according to claim 17, further comprising:
    transmitting the compressed data uphole to a processor via the telemetry device; and reconstructing the one or more time-based measurements to generate one or more reconstructed time-based measurements, wherein the one or more reconstructed time-based measurements are based on the compressed data received from the telemetry device.

19. The method according to claim 18, further comprising:
applying a correction technique to the reconstructed data to produce corrected data within a predetermined range of error.

20. The method according to claim 18, further comprising:
calculating the one or more properties associated with the underground formation based on the reconstructed data.

21. The method according to claim 20, wherein the one or more properties associated with the underground formation comprises porosity or bound fluid volume of the underground formation.

22. The method according to claim 17, wherein the one or more time-based measurements comprises at least one NMR $T_2$ distribution waveform measurement.

23. The method according to claim 17, wherein the telemetry device is a mud pulse telemetry device, wired drill pipe, an electromagnetic telemetry device or an acoustic telemetry device.

* * * * *